United States Patent
Hwang et al.

(10) Patent No.: US 9,405,194 B2
(45) Date of Patent: Aug. 2, 2016

(54) FACILITY AND METHOD FOR TREATING SUBSTRATE

(71) Applicant: Semes Co., Ltd., Cheonan-si, Chungcheongnam-do (KR)

(72) Inventors: Soo Min Hwang, Cheonan-si (KR); Dong Ho Kim, Cheonan-si (KR); Won Jin Kim, Cheonan-si (KR); Ho Shin Kang, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 258 days.

(21) Appl. No.: 14/091,764

(22) Filed: Nov. 27, 2013

(65) Prior Publication Data
US 2014/0152966 A1   Jun. 5, 2014

(30) Foreign Application Priority Data

Nov. 30, 2012  (KR) .................. 10-2012-0138115
Dec. 27, 2012  (KR) .................. 10-2012-0154531

(51) Int. Cl.
*G03D 5/00*     (2006.01)
*G03F 7/16*     (2006.01)
*G03F 7/20*     (2006.01)
*G03F 7/30*     (2006.01)

(52) U.S. Cl.
CPC ............ *G03F 7/162* (2013.01); *G03F 7/2035* (2013.01); *G03F 7/3021* (2013.01)

(58) Field of Classification Search
CPC ........................................... G03F 7/162
USPC ......................................... 396/611
See application file for complete search history.

(56) References Cited

U.S. PATENT DOCUMENTS

| | | | |
|---|---|---|---|
| 6,089,811 A | 7/2000 | Watanabe et al. | |
| 7,628,574 B2 * | 12/2009 | Pak | C23C 16/54 414/217 |
| 7,651,306 B2 * | 1/2010 | Rice | H01L 21/67173 414/217 |
| 7,699,021 B2 * | 4/2010 | Volfovski | G03B 27/32 118/50 |
| 7,798,764 B2 * | 9/2010 | Rice | G03F 7/70991 414/805 |
| 7,819,079 B2 * | 10/2010 | Englhardt | G03F 7/70991 118/50 |
| 7,950,407 B2 * | 5/2011 | Mimken | H01L 21/67057 137/14 |
| 8,545,118 B2 * | 10/2013 | Ogura | H01L 21/67196 396/611 |
| 8,840,728 B2 * | 9/2014 | Terada | B29C 33/58 101/483 |
| 8,851,008 B2 * | 10/2014 | Fukutomi | H01L 21/6715 118/300 |
| 8,911,193 B2 * | 12/2014 | Rice | 414/222.13 |
| 9,165,807 B2 * | 10/2015 | Fukutomi | H01L 21/67017 |
| 2004/0005149 A1 * | 1/2004 | Sugimoto | G03F 7/70691 396/564 |
| 2007/0272327 A1 * | 11/2007 | Lin | G03F 7/162 141/286 |

FOREIGN PATENT DOCUMENTS

| | | |
|---|---|---|
| CN | 102714135 A | 10/2012 |
| JP | 2011-253897 A | 12/2011 |
| KR | 2002-0006469 A | 1/2002 |
| KR | 2005-0076116 A | 7/2005 |

\* cited by examiner

*Primary Examiner* — Rodney Fuller
(74) *Attorney, Agent, or Firm* — Harness, Dickey & Pierce, P.L.C.

(57) ABSTRACT

Provided is a method of a substrate treatment. The method includes providing an operation module with substrates contained in a lot and performing an operation treatment thereon and performing a test treatment on the substrates completed with the operation treatment in a test module. The performing of the test treatment includes determining a substrate to be tested, which is provided to the test module, to allow the test treatment to be completed within an operation treatment time for the substrates in a unit lot.

20 Claims, 11 Drawing Sheets

FACILITY AND METHOD FOR TREATING SUBSTRATE

CROSS-REFERENCE TO RELATED APPLICATIONS

This U.S. non-provisional patent application claims priority under 35U.S.C. §119 of Korean Patent Application Nos. 10-2012-0138115, filed on Nov. 30, 2012, and 10-2012-0154531, filed on Dec. 27, 2012, the entire contents of which are hereby incorporated by reference.

BACKGROUND OF THE INVENTION

The present invention disclosed herein relates to a facility and method for treating a substrate, and more particularly, a facility and method for treating a substrate, the facility including a test module inspecting a wafer finished with an operation process.

As one of processes of manufacturing a semiconductor device or a flat display panel, a series of operations of forming a resist film on a substrate, exposing the corresponding resist film to light by using a photomask, and developing the same is performed. A treatment described above is performed by using a system including an exposure device connected to an coating-development device for coating with resist solution or developing. Certain tests, for example, tests for a critical dimension of a resist pattern, an overlap state of the resist pattern and a base pattern, and a developing defect are performed on a substrate formed with the resist pattern. Then, only a substrate determined as being acceptable is sent to a next operation process.

Tests on the substrate described above are generally performed by a stand-alone test device installed separately from an coating-development device. However, an inline system in which a substrate test device is installed in an coating-development device may be used.

As a method of inspecting a substrate, there are a total test method of sequentially inspecting all substrates by a lot as a unit and a sampling test method of testing for each amount previously set. Test methods described above may generate a standby time for a substrate test, thereby increasing a total necessary time for substrates. A test standby time increases when a substrate test time is longer than an coating-development treatment time.

SUMMARY OF THE INVENTION

The present invention provides a substrate treatment facility and method capable of reducing a decline in production caused by a substrate test time.

Aspects are not limited thereto and will be apparent to those skilled in the art from the disclosure as follows.

Embodiments of the present invention provide methods of treating a substrate, including providing an operation module with substrates contained in a lot and performing an operation treatment thereon and performing a test treatment on the substrates completed with the operation treatment in a test module. The performing of the test treatment may include determining a substrate to be tested, which is provided to the test module, to allow the test treatment to be completed within an operation treatment time for the substrates in a unit lot.

In some embodiments, the performing of the test treatment may include calculating an estimated necessary time for the entire operation treatments for the substrate in the unit lot and determining the substrate to be tested to allow the test treatment to be completed within the estimated necessary time.

In other embodiments, the performing of the test treatment may include when an estimated completion point in time of the test treatment for a substrate to be provided to the test module is later than a point in time of completing an operation treatment for a substrate finally treated in the operation module among the substrates in the unit lot, containing the corresponding substrate in the lot without passing through the test treatment.

In still other embodiments, the performing of the test treatment may include sampling some of the substrates performed with the operation treatment in the operation module and determining as the substrate to be tested.

In even other embodiments, the performing of the test treatment may include determining a substrate sequentially completed with the operation treatment in an order of being performed with the operation treatment in the operation module as the substrate to be tested.

In yet other embodiments, the performing of the operation treatment may include coating a substrate with photoresist and performing a developing treatment on the substrate, coated with photoresist. The performing the test treatment may include determining the substrate completed with the developing treatment as the substrate to be tested.

In further embodiments, the performing of the developing treatment may include performing a developing operation on the substrate, coated with photoresist and performing a heat treatment on the substrate completed with the developing operation.

In still further embodiments, the operation module may include a plurality of chambers allowing the performing of the operation treatment, and the performing of the test treatment may include determining only the substrate completed with the operation treatment in a certain one among the chambers as the substrate to be tested.

In even further embodiments, the operation module may include a plurality of chambers allowing the performing of the operation treatment, and the performing of the test treatment may include determining at least one of the substrates completed with the operation treatment in the chambers for each chamber as the substrate to be tested.

In yet further embodiments, the lot may include a first lot containing n number of substrates and a second lot containing m number of substrates. After performing the operation treatment and the test treatment on the substrates of the first lot, the operation treatment and the test treatment may be performed on the substrates of the second lot. The performing of the test treatment on the substrates of the first lot may include determining the substrate to be tested among the substrates of the first lot to allow the test treatment for the substrates of the first lot to be completed within an operation treatment time for the substrates of the first lot. The performing of the test treatment on the substrates of the second lot may include determining the substrate to be tested among the substrates of the second lot to allow the test treatment for the substrates of the second lot to be completed within an operation treatment time for the substrates of the second lot.

In much further embodiments, an order of determining the substrate to be tested among the substrates of the first lot may differ from an order of determining the substrate to be tested among the substrates of the second lot.

In still much further embodiments, the n may be a natural number greater than m. A number of the substrates to be tested, determined among the substrates of the first lot, may be greater than a number of the substrates to be tested, determined among the substrates of the second lot.

In other embodiments of the present invention, substrate treatment facilities include a load port, on which a lot containing a plurality of substrates is disposed, an operation module performing an operation treatment on the substrate, an index module located between the load port and the operation module and including an index robot transferring the substrate, a test module performing a test treatment on a substrate completed with the operation treatment in the operation module, and a control unit determining a substrate to be tested, which is provided to the test module, to allow the test treatment of the test module to be completed within an operation treatment time for the substrates of the unit lot in the operation module.

In some embodiments, the operation module may include an coating module coating the substrate with photoresist and a developing module performing a developing treatment on the substrate coated with the photoresist. The control unit may determine the substrates completed with the developing treatment as the substrate to be tested.

In other embodiments, the operation module may have a multi-layer structure, in which the coating module may be provided on a top of the developing module. The developing module may include a plurality of developing chambers performing a developing operation and arranged in a row and baking chambers performing a heat treatment on a substrate performed with the developing operation and arranged in parallel with the developing chambers. The test module may include test chambers located between the index module and the baking chambers and testing a substrate completed with the heat treatment.

In still other embodiments, the operation module may have a single layer structure. The developing module may include a plurality of developing chambers performing a developing operation and baking chambers performing a heat treatment on a substrate performed with the developing operation. The coating module may include a plurality of coating chambers performing the coating treatment. The developing chambers and the coating chambers may be arranged in a row in one direction. The baking chambers may be arranged in a row in parallel with the developing chambers and the coating chambers. The test module may include a test chamber located between the index module and the baking chambers and testing a substrate completed with the heat treatment.

In even other embodiments, the operation module may include a plurality of chambers performing the same treatment on the substrate. The control unit may determine only a substrate completed with the operation treatment in a certain one of the chambers as the substrate to be tested.

In yet other embodiments, the operation module may include a plurality of chambers performing the same treatment on the substrate. The control unit may determine at least one substrate completed with the operation treatment for each of the chambers as the substrate to be tested.

In further embodiments, the lot may include a first lot containing n number of substrates and a second lot containing m number of substrates. The control unit may control treatments to be sequentially performed on the m number of substrates of the second lot after completing the treatments on the n number of substrates of the first lot, may determine the substrate to be tested among the substrates of the first lot to allow the test treatment for the substrates of the first lot to be completed within an operation treatment time for the n number of substrates of the first lot, and may determine the substrate to be tested among the substrates of the second lot to allow the test treatment for the substrates of the second lot to be completed within an operation treatment time for the m number of substrates of the second lot.

In still further embodiments, the control unit may control an order of determining the substrate to be tested among the substrates of the first lot to differ from an order of determining the substrate to be tested among the second substrates of the second lot.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
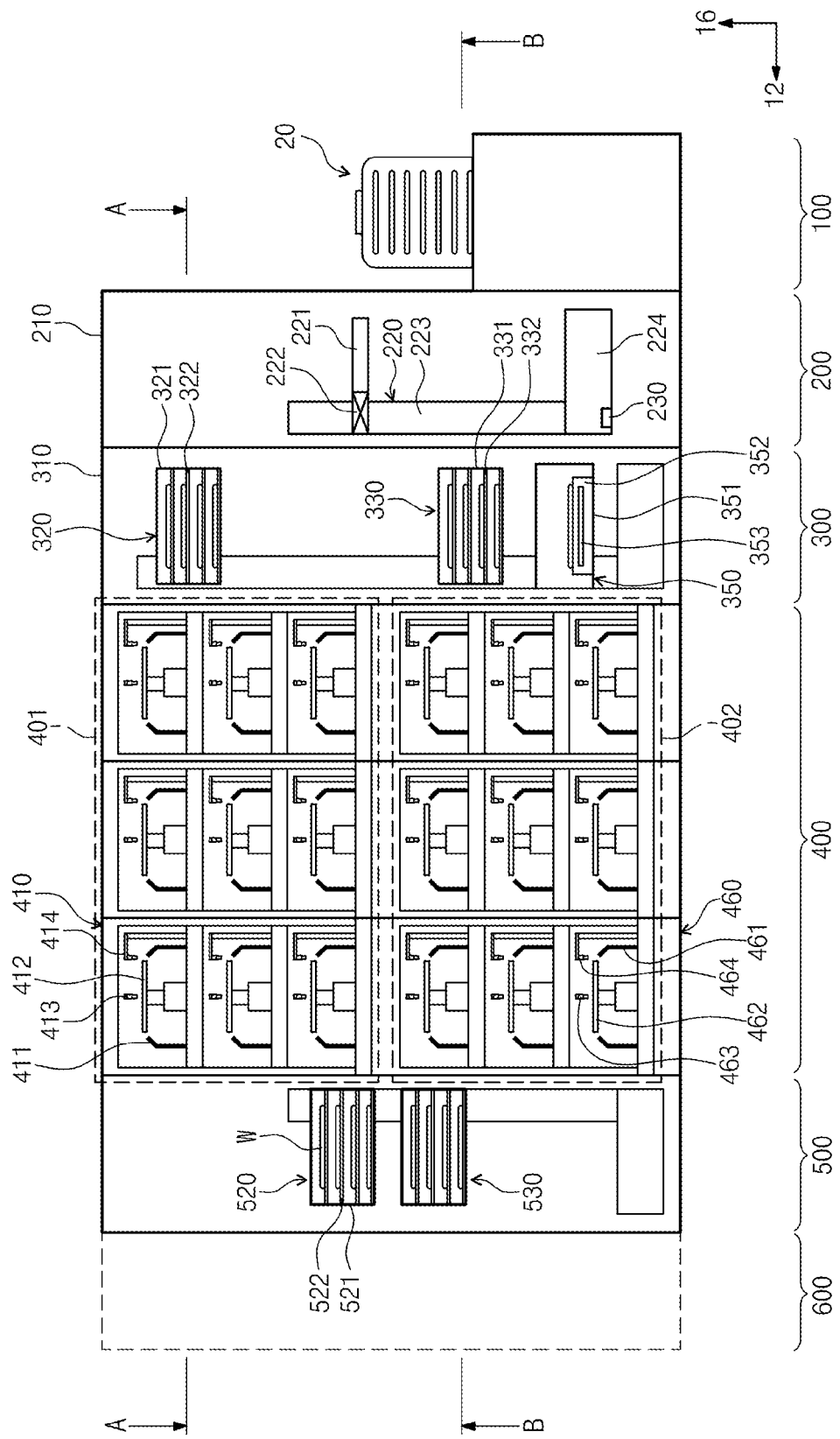
FIG. 1 is a lateral cross-sectional view illustrating a substrate treatment facility.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, embodiments of the present invention will be described in detail with reference to the attached drawings. The embodiments of the present invention may be modified into various forms, and the scope of the present invention is not limited to the following embodiments. The embodiments are provided to more perfectly explain the present invention to a person with ordinary skill in the art. Accordingly, shapes of elements in the drawings are exaggerated for more accurate descriptions.

A facility according to the embodiments is used to perform a photolithography process on a substrate such as a semiconductor wafer and a flat display panel. Particularly, the facility is used to perform an coating process and a development process on a substrate. Hereinafter, a case, in which a wafer is used as a substrate, will be described as an example.

Figure 2:
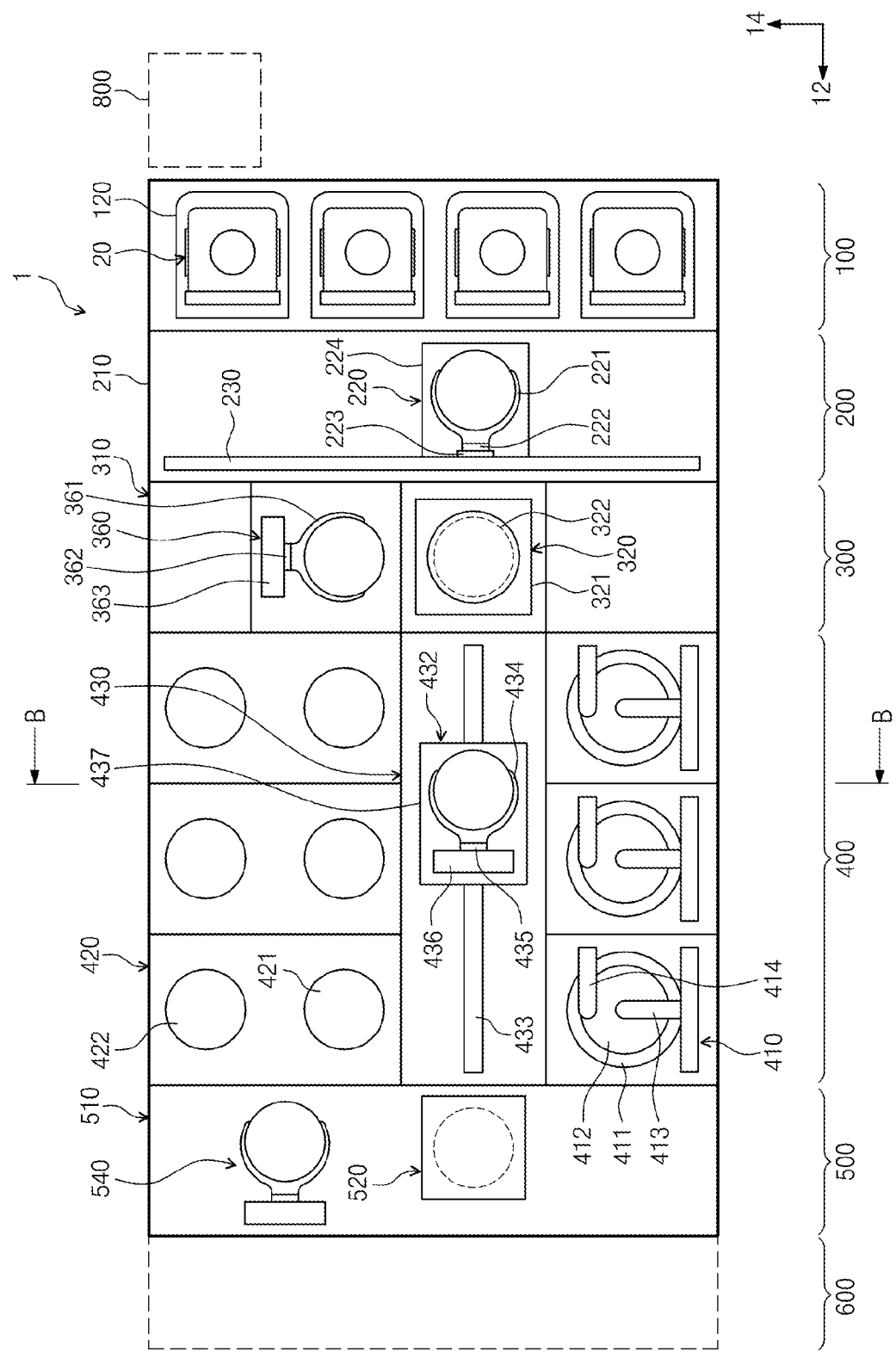
FIG. 2 is a view illustrating the facility from a direction of A-A shown in FIG. 1.
Figure 3:
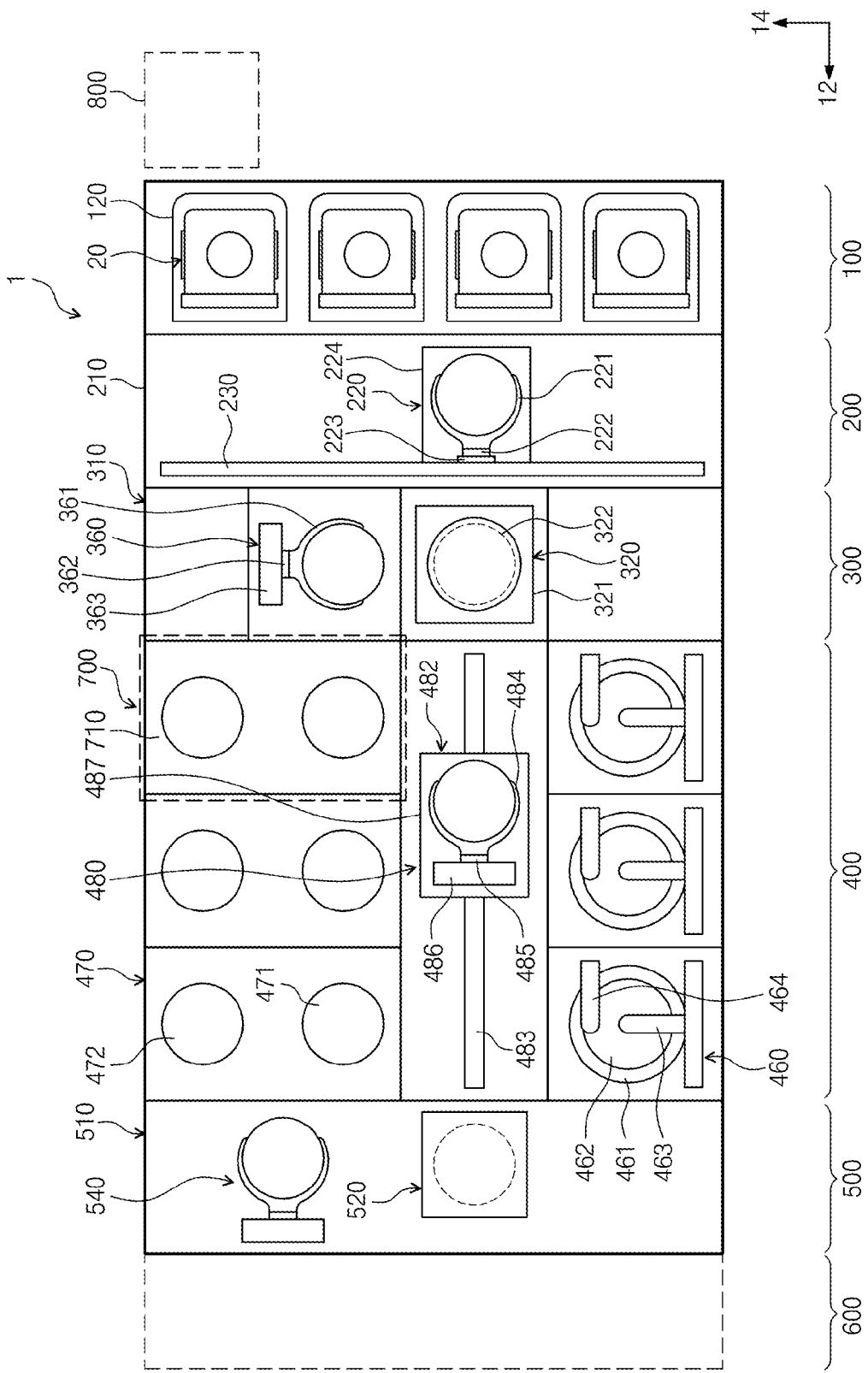
FIG. 3 is a view illustrating the facility from a direction of B-B shown in FIG. 1.
Figure 4:
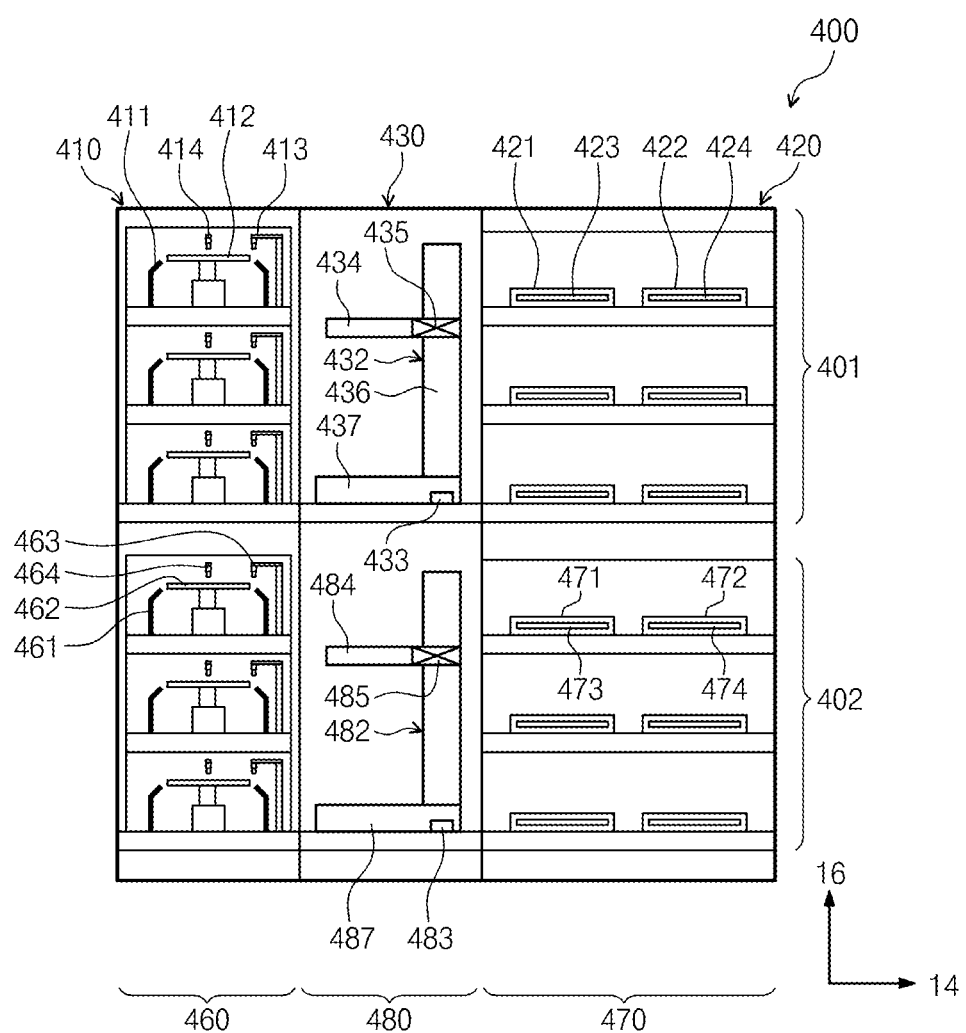
FIG. 4 is a view illustrating the facility from a direction of C-C shown in FIG. 2.

FIGS. 1 to 4 are views schematically illustrating a substrate treatment facility 1 according to an embodiment of the present invention. FIG. 1 is a lateral cross-sectional view illustrating the facility 1, FIG. 2 is a view illustrating the facility from a direction of A-A shown in FIG. 1, FIG. 3 is a view illustrating the facility from a direction of B-B shown in FIG. 1, and FIG. 4 is a view illustrating the facility from a direction of C-C shown in FIG. 2;

The facility 1 includes a load port 100, an index module 200, a buffer module 300, an operation module 400, an interface module 500, a test module 700, and a control unit 800. The load port 100, the index module 200, the buffer module 300, the operation module 400, and the interface module 500 are sequentially arranged in a row in one direction. Hereinafter, the direction, in which the index module 200, the buffer module 300, the operation module 400, and the interface module 500 are arranged, is designated as a first direction 12. When viewed from above, a direction perpendicular to the first direction 12 is designated as a second direction 14. A direction perpendicular to the first direction 12 and the second direction 14, respectively, is designated as a third direction 16.

A wafer W is transferred while being contained in a lot 20. In this case, the lot 20 has a structure sealed from the outside. For example, as the lot 20, a front open unified pod (FOUP) having a door at a front thereof may be used. Hereinafter, referring to FIGS. 1 to 4, respective components will be described in detail.

The load port 100 has a stand 120, on which the lot 20 containing the wafers W is disposed. The stand 120 is provided in a plurality thereof. The stands 120 are arranged in a row in the second direction 14. In FIG. 1, four stands 120 are provided.

The index module 200 transfers the wafer W between the lot 20 disposed on the stand 120 of the load port 100 and the buffer module 300. The index module 200 includes a frame 210, an index robot 220, and a guide rail 230. The frame 210 has a hollow rectangular parallelepiped shape and is disposed between the load port 100 and the buffer module 300. The frame 210 of the index module 200 may have a height smaller than a frame 310 of the buffer module 300. The index robot 220 and the guide rail 230 are disposed in the frame 210. The index robot 220 has a four-axis drive structure to allow a hand 221 directly handling the wafer W to move and rotate in the first direction 12, the second direction 14, and the third direction 16. The index robot 220 includes the hand 221, an arm 222, a supporter 223, and a support 224. The hand 221 is fastened to and installed on the arm 222. The arm 222 has a stretchable and rotatable structure. The supporter 223 is disposed to allow a length direction thereof to be in the third direction 16. The arm 222 is combined with the supporter 223 to be movable along the supporter 223. The supporter 223 is fastened to and combined with the support 224. The guide rail 230 is disposed to allow a length direction thereof to be in the second direction 14. The support 224 is combined with the guide rail 230 to be movable in a straight line along the guide rail 230. Also, not shown in the drawing, a door opener opening and closing the door of the lot 20 is further provided in the frame 210.

The buffer module 300 includes the frame 310, a first buffer 320, a second buffer 330, a cooling chamber 350, and a buffer robot 360. The frame 310 has a hollow rectangular parallelepiped shape and is disposed between the index module 200 and the operation module 400. The first buffer 320, the second buffer 330, the cooling chamber 350, and the buffer robot 360 are located in the frame 310. The cooling chamber 350, the second buffer 330, and the first buffer 320 are sequentially disposed in the third direction 16 from below. The first buffer 320 is located at a height corresponding to an coating module 401 of the operation module 400 described below. The second buffer 330 and the cooling chamber 350 are located at a height corresponding to a developing module 402 of the operation module described below. The buffer robot 360 is separated from the second buffer 330, the cooling chamber 350, and the first buffer 320 with a certain interval in the second direction 14.

The first buffer 320 and the second buffer 330 temporarily contain a plurality of wafers W, respectively. The second buffer 330 includes a housing 331 and a plurality of supporters 332. The supporters 332 are disposed in the housing 331 and separated from one another in the third direction 16. On each of the supporters 332, one wafer W is disposed. The housing 331 includes openings (not shown) in directions of providing the index robot 220, the buffer robot 360, and a developing robot 482 of the developing module 402 described below to allow the index robot 220, the buffer robot 360, and the developing robot 482 to load and unload the wafer W onto and from the supporter 332. The first buffer 320 has a structure substantially similar to the second buffer 330. Merely, a housing 321 of the first buffer 320 includes openings in directions of providing the buffer robot 360 and an coating unit robot 432 located in the coating module 401 described below. The number of supporters 322 provided in the first buffer 320 and the number of the supporters 332 provided in the second buffer 330 may be identical to each other or may be different from each other. According to an example, the number of supporters 332 provided in the second buffer 330 may be greater than the number of the supporters 322 provided in the first buffer 320.

The buffer robot 360 transfers the wafer W between the first buffer 320 and the second buffer 330. The buffer robot 360 includes the hand 361, an arm 362, and a supporter 363. The hand 361 is fastened to and installed in the arm 362. The arm 362 is stretchable to allow the hand 361 to move in the second direction 14. The arm 362 is combined with the supporter 363 to be movable in a straight line along the supporter 363 in the third direction 16. The supporter 363 has a length extended from a position corresponding to the second buffer 330 to a position corresponding to the first buffer 320. The supporter 363 may be longer up and down than this. The first buffer robot 360 may allow the hand 361 to be simply two-axis driven in the second direction 14 and the third direction 16.

The cooling chamber 350 cools down each of the wafers W. The cooling chamber 350 includes a housing 351 and a cooling plate 352. The cooling plate 352 includes a cooling member 353 cooling down a top surface, on which the wafer W is disposed, and the wafer W. The cooling member 353 may cool down by using various methods using cooling water or a thermoelectric element. Also, a lift pin assembly (not shown) locating the wafer W on the cooling plate 352 may be provided in the cooling chamber 350. The housing 351 includes openings (not shown) in directions of providing the index robot 220 and the developing robot 482 to allow the index robot 220 and the developing robot 482 provided in the developing module 402 described below to load and unload the wafer W onto and from the cooling plate 352. Also, the cooling chamber 350 may include doors (not shown) for closing the openings described above.

The operation module 400 performs an coating treatment of coating the wafer W with photoresist and a development treatment of developing the wafer W after an exposure operation. The operation module 400 generally has a rectangular parallelepiped shape. The operation module 400 includes the coating module 401 and the development module 402. The coating module 401 and the development module 402 are disposed to be mutually divided by a layer. According to an example, the coating module 401 is located above the development module 402.

The coating module 401 performs an operation of coating the wafer W with a photosensitive solution such as photoresist operation such as heating and cooling down the wafer W before and after a resist coating operation. The coating module 401 includes a resist coating chamber 410, a baking chamber 420, and a transfer chamber 430. The resist coating chamber 410, the baking chamber 420, and the transfer chamber 430 are sequentially disposed in the second direction 14. Accordingly, the resist coating chamber 410 and the baking chamber 420 are separated from each other disposing the transfer chamber 430 therebetween in the second direction 14. The resist coating chamber 410 is provided in a plurality thereof in the first direction 12 and the third direction 16, respectively. In the drawing, six resist coating chambers 410 are provided. The baking chamber 420 is provided in a plurality thereof in the first direction 12 and the third direction 16, respectively. In the drawing, six baking chambers 420 are provided. However, differently, the baking chambers 420 may be provided in a larger number thereof.

The transfer chamber 430 is located parallel to the first buffer 320 of the buffer module 300 in the first direction 12. In the transfer chamber 430, the coating unit robot 432 and a guide rail 433 are located. The transfer chamber 430 generally has a rectangular shape. The coating unit robot 432 transfers the wafer W among the baking chambers 420, the resist coating chambers 400, the first buffer 320 of the buffer module 300, and a first buffer 520 of the interface module 500 described below. The guide rail 433 is arranged to allow a length direction thereof to be parallel to the first direction 12. The guide rail 433 guides the coating unit robot 432 to move in a straight line in the first direction 12. The coating unit robot 432 includes a hand 434, an arm 435, a supporter 436, and a support 437. The hand 434 is fastened to and installed in the arm 435. The arm 435 is stretchable to allow the hand 434 to move horizontally. The supporter 436 is disposed to allow a length direction thereof to be in the third direction 16. The arm 435 is combined with the supporter 436 to be movable in a straight line along the supporter 436 in the third direction 16. The supporter 436 is fastened to and combined with the support 437. The support 437 is combined with the guide rail 433 to be movable along the guide rail 433.

The resist coating chambers 410 all have the same configuration. Merely, different kinds of photoresists may be used by the resist coating chambers 410, respectively. As an example, as the photoresist, chemical amplification resist may be used. The resist coating chamber 410 coats the wafer W with photoresist. The resist coating chamber 410 includes a housing 411, a supporting plate 412, and a nozzle 413. The housing 411 has the shape of a cup with an open top. The supporting plate 412 is located in the housing 411 and supports the wafer W. The supporting plate 412 is provided to be rotatable. The nozzle 413 supplies the photoresist onto the wafer W disposed on the supporting plate 412. The nozzle 413 has a circular tube shape and may supply the photoresist to a center of the wafer W. Selectively, the nozzle 413 may have a length corresponding to a diameter of the wafer W and an outlet of the nozzle 413 may be provided as a slit. Also, additionally, a nozzle 414 for supplying a cleaning solution such as deionized water may be further provided in the resist coating chamber 410 to clean a surface of the wafer Wcoated with the photoresist.

The baking chamber 420 thermally treats the wafer W. For example, the baking chambers 420 performs a prebaking operation of removing organic materials or moisture on the surface of the wafer W by heating the wafer W with a certain temperature before coating with the photoresist, a soft baking operation performed after coating the wafer W with photoresist, and a cooling down operation of cooling down the wafer W after the respective heating operations. The baking chamber 420 includes one of a cooling plate 421 and a heating plate 422. The cooling plate 421 is provided with a cooling member 423 using cooling water or a thermoelectric element. The heating plate 422 is provided with a heating member 424 using heat rays or a thermoelectric element. The cooling plate 421 and the heating plate 422 may be provided in one baking chamber 420, respectively. Selectively, some of the baking chambers 420 may include only the cooling plate 421 and other may include only the heating plate 422.

The developing module 402 performs a developing operation of supplying a developing solution to the wafer W and removing a part of the photoresist to obtain a pattern and a heat treatment operation of heating and cooling down the wafer W before and after the developing operation. The developing module 402 includes a developing chamber 460, a baking chamber 470, and a transfer chamber 480. The developing chamber 460, the baking chamber 470, and the transfer chamber 480 are sequentially arranged in the second direction 14. Accordingly, the developing chamber 460 and the baking chamber 470 are separated from each other disposing the transfer chamber 480 therebetween in the second direction 14. The developing chamber 460 is provided in a plurality thereof in the first direction 12 and the third direction 16, respectively. In the drawing, six developing chambers 460 are provided. The baking chamber 470 is provided in a plurality thereof in the first direction 12 and the third direction 16, respectively. In the drawing, four developing chambers 470 are provided. However, differently, the baking chambers 470 may be provided in a larger number thereof.

The transfer chamber 480 is located parallel to the second buffer 330 of the buffer module 300 in the first direction 12. In the transfer chamber 480, a developing unit robot 482 and a guide rail 483 are located. The transfer chamber 480 generally has a rectangular shape. The developing unit robot 482 transfers the wafer W among the baking chambers 470, the developing chambers 460, the second buffer 330 of the buffer module 300, and a second buffer 530 of the interface module 500 described below. The guide rail 483 is disposed to allow a length direction thereof to be parallel to the first direction 12. The guide rail 483 guides the developing unit robot 482 to move in a straight line in the first direction 12. The developing unit robot 482 includes a hand 484, an arm 485, a supporter 486, and a support 487. The hand 484 is fastened to and installed in the arm 485. The arm 485 is stretchable to allow the hand 484 to move horizontally. The supporter 486 is disposed to allow a length direction thereof to be in the third direction 16. The arm 485 is combined with the supporter 486 to be movable in a straight line along the supporter 486 in the third direction 16. The hand 486 is fastened to and combined with the support 487. The support 487 is combined with the guide rail 483 to be movable along the guide rail 483.

The developing chambers 460 all have the same configuration. Merely, different kinds of developing solutions may be used in the developing chambers 460, respectively. The developing chamber 460 removes an area of the photoresist on the wafer W, to which light is emitted. In this case, an area of a protective film, to which light is emitted, is also removed.

Selectively, according to a kind of used photoresist, only areas of the photoresist and protective film, to which light is not emitted, may be removed.

The developing chamber 460 includes a housing 461, a supporting plate 462, and a nozzle 463. The housing 461 has the shape of a cup with an open top. The supporting plate 462 is located in the housing 461 and supports the wafer W. The supporting plate 462 is provided to be rotatable. The nozzle 463 supplies a developing solution onto the wafer W disposed on the supporting plate 462. The nozzle 463 has a circular tube shape and may supply the developing solution to a center of the wafer W. Selectively, the nozzle 463 may have a length corresponding to a diameter of the wafer W and an outlet of the nozzle 463 may be provided as a slit. Also, a nozzle 464 for supplying a cleaning solution such as deionized water may be further provided to clean the surface of the wafer W, onto which the developing solution is supplied.

The baking chamber 470 thermally treats the wafer W. For example, the baking chambers 470 performs a post baking operation of heating the wafer W before performing the developing operation, a hard baking operation of heating the wafer W after performing the post baking operation and the developing operation, and a cooling down operation of cooling down a heated substrate after the respective baking operations. The baking chamber 470 includes one of a cooling plate 471 and a heating plate 472. The cooling plate 471 is provided with a cooling member 473 using cooling water or a thermoelectric element. Otherwise, the heating plate 472 is provided with a heating member 474 using heat rays or a thermoelectric element. The cooling plate 471 and the heating plate 472 may be provided in one baking chamber 470, respectively. Selectively, some of the baking chambers 470 may include only the cooling plate 471 and other may include only the heating plate 472.

The interface module 500 transfers the wafer W between the operation module 400 and an exposure device 600. The interface module 500 includes a frame 510, a first buffer 520, a second buffer 530, and a interface robot 540. The first buffer 520, the second buffer 530, and the interface robot 540 are located in the frame 510. The first buffer 520 and the second buffer 530 are separated from each other with a certain distance to be mutually deposited. The first buffer 520 is disposed higher than the second buffer 530. The first buffer 520 is located at a height corresponding to the coating module 401, and the second buffer 530 is disposed at a height corresponding to the developing module 402. When viewed from above, the first buffer 520 is disposed together with the transfer chamber 430 of the coating module 401 in a row in the first direction 12 and the second buffer 530 is located to be disposed together with the transfer chamber 480 of the developing module 402 in a row in the first direction 12.

The interface robot 540 is located to be separated from the first buffer 520 and the second buffer 530 in the second direction 14. The interface robot 540 transports the wafer W among the first buffer 520, the second buffer 530, and the exposure device 600. The interface robot 540 has a structure substantially similar to the buffer robot 360.

The first buffer 520 temporarily stores the wafers W, on which operations are performed by the coating module 401, before transferring the wafers W to the exposure device 600. Also, the second buffer 530 temporarily stores the wafers W completed with operations of the exposure device 600 before transferring the wafers W to the developing module 402. The first buffer 520 includes a housing 521 and a plurality of supporters 522. The supporters 522 are disposed in the housing 521 and separated from one another in the third direction 16. On each of the supporters 522, one wafer W is disposed.

The housing 521 includes openings (not shown) in directions of providing the interface robot 540 and the coating unit robot 432 to allow the interface robot 540 and the coating unit robot 432 to load and unload the wafer W on and from the supporter 522 in the housing 521. The second buffer 530 has a structure substantially similar to the second buffer 520. Merely, a housing 531 of the second buffer 530 includes openings (not shown) in directions of providing the interface robot 540 and the developing robot 482. In an interface module, without a chamber for performing a certain operation on a wafer, buffers and robots may be provided as described above.

The test module 700 performs a test on the wafer W completed with the operation treatments in the operation module 400. The test module 700 tests the wafer W completed with the developing operation and baking operation in the developing module 402. The test module 700 is formed by uniting a defect test device for detecting inconvenience of the developing treatment and a defect, an impurity test device for testing impurities on the surface of the wafer W, a critical dimension measurement device for measuring a critical dimension (CD) of a pattern of a photoresist film formed on the wafer W, an overlap fit test device for testing the degree of precision of an overlap fit between the wafer W after the exposure and a photomask, a residue test device for detecting a resist residue on the wafer W after the developing treatment, and a defocus test device for detecting a positional difference of a pattern formed by the exposure device 600, which may be appropriately determined according to a kind of a desired test. Also, the number and a layout of the respective test units may be determined depending on the kind of desired tests or installation spaces.

The test module 700 may be disposed in the operation module 400. The test module 700 includes a test chamber 710 providing a space for performing tests. The test chamber 710 may be disposed on a bottom of the operation module 400, in which the developing module 402 is disposed. The test chamber 710 is disposed between the baking chambers 470 of the developing module 402 and the index module 300, while being disposed together with the baking chambers 470 in a row in the first direction 12. The test 710 may be provided in a plurality thereof deposited in the third direction 16.

The control unit 800 determines a substrate to be tested and is provided to the test module 700, among the wafers W completed with operation treatments in the operation module 400. The control unit 800 determines the substrate to be tested to allow a test treatment to be completed within an operation treatment time for the wafers W in the unit lot 20. The control unit 800 calculates an estimated necessary time of an operation treatment for the whole wafers W in the unit lot 20 and determines the substrate to be tested and provided to the test module 700 in order to complete the test treat within the estimated time of the operation treatment. The control unit 800 determines some of the wafers W completed with the operation treatment in the operation module 400 as the substrate to be tested. The control unit 800 may sample the wafers W to be completed with the operation treatment in the operation module 400 with a certain cycle and determine the same as the substrate to be tested. Differently, the control unit 800 may sequentially determine the wafers W in an order of being completed with the operation treatment in the operation module 400 as the substrate to be tested. A method of determining the substrate to be tested by the control unit 800 will be described in detail with reference to FIGS. 5 to 10.

Hereinafter, a method of treating the wafer W using the substrate treatment facility 1 will be described.

The lot 20 containing the wafers W is disposed on the stand 120 of the load port 100. The door of the lot 20 is opened by the door opener. The index robot 220 takes out the wafer W from the lot 20 and transports the wafer W to the second buffer 330. The buffer robot 360 transports the wafer W contained in the second buffer 330 to the first buffer 320. The coating unit robot 432 takes out the wafer W from the first buffer 320 and transports the wafer W to the baking chamber 420 of the coating module 401. The baking chamber 420 sequentially performs prebaking and cooling down operations. The coating unit robot 432 takes out the wafer W from the baking chamber 420 and transports the wafer W to the resist coating chamber 410. The resist coating chamber 410 coats the wafer W with photoresist. After that, the coating unit robot 432 takes out the wafer W from the resist coating chamber 410 and transports the wafer W to the baking chamber 420. The baking chamber 420 performs a soft baking operation on the wafer W.

The coating unit robot 432 takes out the wafer W from the baking chamber 420 and transports the wafer W to the first buffer 520 of the interface module 500. The interface robot 540 transports the wafer W from the first buffer 520 to the exposure device 600. In the exposure device 600, an exposure operation is performed on the wafer W. After that, the interface robot 540 transports the wafer W from the exposure device 600 to the second buffer 530.

The developing unit robot 482 takes out the wafer W from the second buffer 530 and transports the wafer W to the baking chamber 470 of the developing module 402. The baking chamber 470 sequentially performs postbaking and cooling down operations. The developing unit robot 482 takes out the wafer W from the baking chamber 470 and transports the wafer W to the developing chamber 460. The developing chamber 460 supplies a developing solution to the wafer W and performs a developing operation. After that, the developing unit robot 482 takes out the wafer W from the developing chamber 460 and transports the wafer W to the baking chamber 470. The baking chamber 470 performs a hard baking operation on the wafer W.

The control unit 800 determines a substrate to be tested among the wafers W completed with coating/developing treatments described above. The wafer W determined as the substrate to be tested is taken out from the baking chamber and is transported to the test chamber 710 by the developing unit robot 482. On the contrary, the wafer W not determined as the substrate to be tested is taken out and transported to the cooling chamber 350 of the buffer module 300 by the developing unit robot 482.

Figure 5:
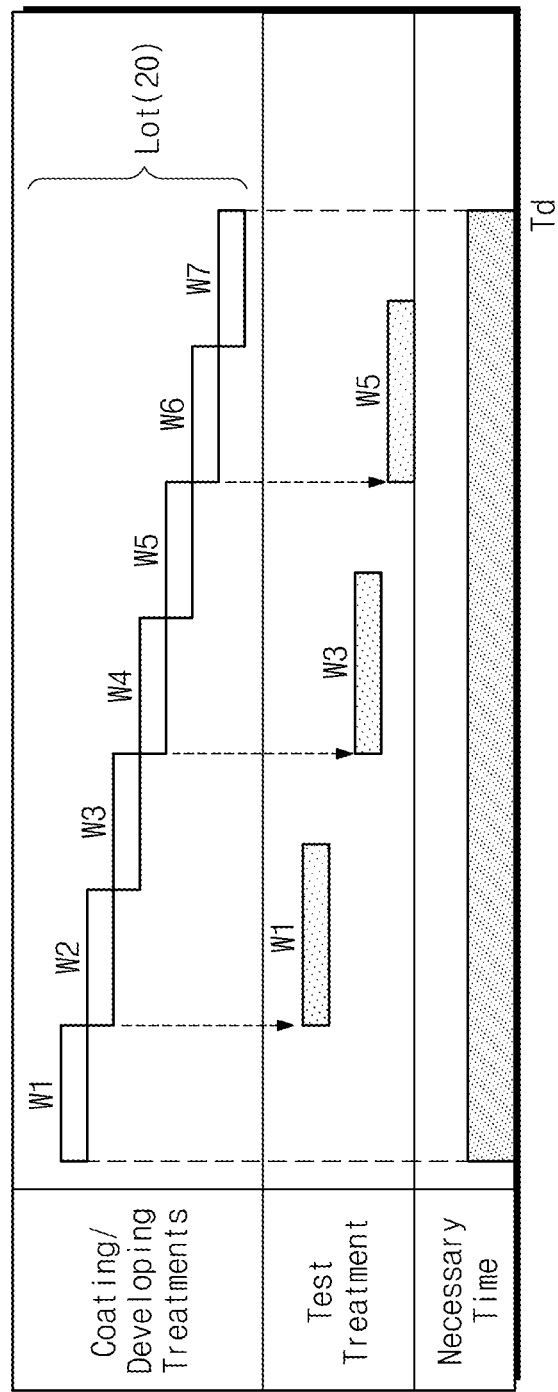
FIG. 5 is a view illustrating an order, in which a control unit determines a substrate to be tested, according to an embodiment of the present invention.

FIG. 5 is a view illustrating an order, in which the control unit 800 determines a substrate to be tested, according to an embodiment of the present invention.

Referring to FIG. 5, coating/developing treatments indicate is a chart illustrating a process, in which the coating and developing treatments are sequentially performed on the wafers W in the coating module 401 and the developing module 402, and a test treatment indicates a process, in which the control unit 800 determines a substrate to be tested and provides the test module 700 with the same to perform the test treatment thereon. A necessary time indicates a time for completing all the coating/developing and test treatments on the wafers W in the unit lot 20. According to the embodiment, seven wafers W1 to W7 are contained in the lot 20 and are sequentially provided for the coating/developing treatments one by one. In the embodiment, a test treatment time is longer than an coating treatment time and a developing treatment time.

The control unit 800 calculates an estimated necessary time Td for the entire operation treatments performed on the seven wafers W1 to W7. Based on the calculated estimated necessary time, the substrate to be tested is determined. When a first wafer W1 is completed with the coating/developing treatments, the control unit 800 determines an estimated test treatment completion time for the first wafer W1 not to be more than the estimated necessary time Td for the entire operation treatments and determines the first wafer W1 as the substrate to be tested. A test treatment for the first wafer W1 continues while coating/developing treatments are being performed on a second wafer W2. While coating/developing treatments are being performed on a third wafer W3, the test treatment for the first wafer W1 is completed. The control unit 800 determines an estimated test treatment completion time for the third wafer W3 not to be more than the estimated necessary time Td for the entire operation treatments and determines the third wafer W3 as the substrate to be tested. A test treatment for the third wafer W3 continues while coating/developing treatments are being performed on a fourth wafer W4. The test treatment for the third wafer W3 is completed while coating/developing treatments are being performed on a fifth wafer W5. The control unit 800 determines an estimated test treatment completion time for the fifth wafer W5 not to be more than the estimated necessary time Td for the entire operation treatments and determines the fifth wafer W5 as the substrate to be tested. A test treatment for the fifth wafer W5 continues while coating/developing treatments are being performed on a sixth wafer W6 and is completed while coating/developing treatments are being performed on a seventh wafer W7. The control unit 800 determines estimated test treatment completion times for the sixth wafer W6 and the seventh wafer W7 to be more than the estimated necessary time Td for the entire operation treatments and does not determine the sixth wafer W6 and the seventh wafer W7 as the substrate to be tested. According to a determination of the control unit described above, the first, third, fifth wafers W1, W3, and W5 are determined as the substrate to be tested and the second, fourth, sixth, and seventh wafers W2, W4, W6, and W7 are not determined as the substrate to be tested. Since the test treatment for the wafers W in the unit lot 20 is completed earlier than the coating/developing treatments for the entire wafers W due to the determination of the control unit 800 for the substrate to be tested, a standby time caused by the test treatment does not occur and an increase in time for treating the wafers W in the unit lot 20 is prevented. In the embodiment, the control unit 800 determines the substrate to be tested with a certain cycle. The control unit 800 determines the wafers W completed with the coating/developing treatments with a cycle of 2n−1 (hereinafter, n is a natural number) as the substrate to be tested. Differently, the control unit 800 may determine the substrate to be tested with a cycle of 3n−1 or a cycle of 3n−2. A cycle for determining the substrate to be tested may be variously changed according to the number of the wafers W provided in the unit lot 20 and a test treatment time for a unit wafer W.

Figure 6:
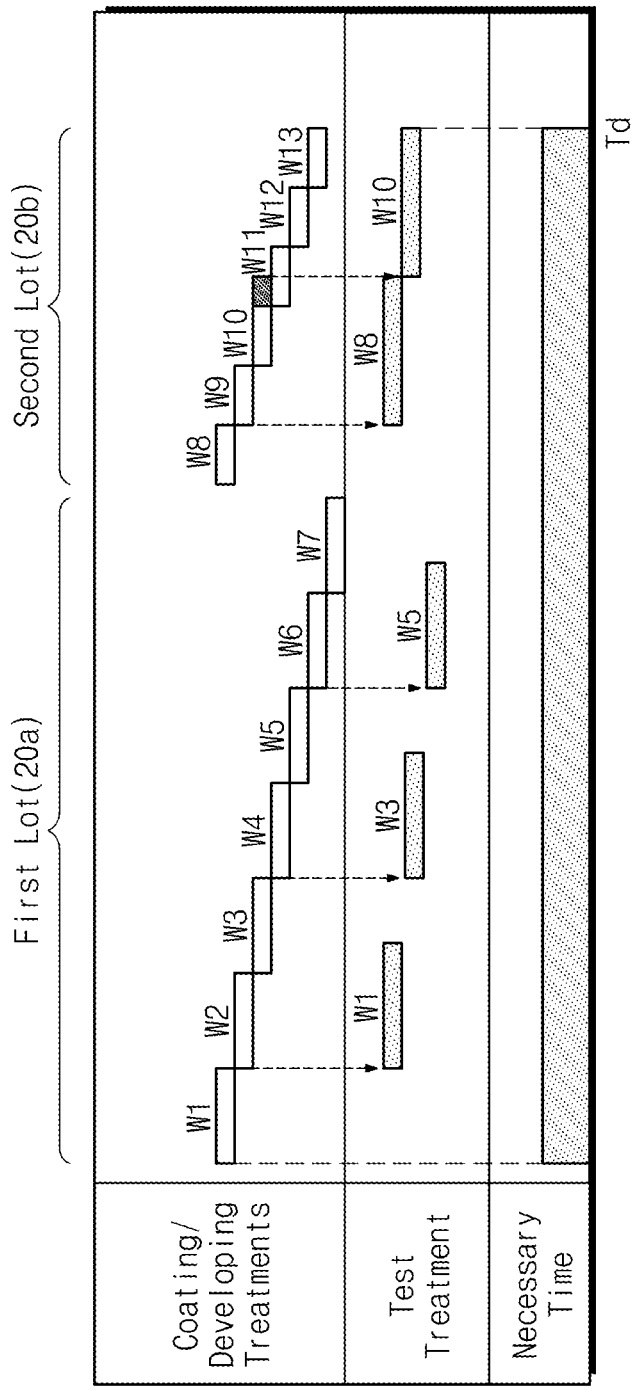
FIG. 6 is a view illustrating an order, in which the control unit determines a substrate to be tested, according to another embodiment of the present invention.

FIG. 6 is a view illustrating an order, in which the control unit 800 determines a substrate to be tested, according to another embodiment of the present invention.

Referring to FIG. 6, two lots 20*a* and 20*b* are provided. In a first lot 20*a*, n number of the wafers W is contained. In a second lot 20*b*, m number of the wafers W is contained. N is a natural number different from m and may be greater than m. According to the embodiment, n may be 7 and m may be 6. The facility 1 performs coating/developing and test treatments on wafers W1 to W7 in the first lot 20*a* and then performs coating/developing and test treatments on wafers W8 to W13 in the second lot 20*b*. A test treatment time for the wafers W8 to W13 in the second lot 20b may be longer than a test treatment time for the wafers W1 to W7 in the first lot 20a.

Since the coating/developing and test treatments for the wafers W1 to W7 in the first lot 20a is identical to the embodiment of FIG. 5 described above, a detailed description thereof will be omitted.

At a point in time when the coating/developing treatments for a first wafer W8 of the second lot 20b are completed, a test treatment is not performed in the test module 700. The control unit 800 determines an estimated test treatment completion times for the first wafer W8 of the second lot 20b not to be more than an estimated necessary time Td for the entire operation treatments for the wafers W8 to W13 of the second lot 20b and determines the first wafer W8 as a substrate to be tested. A test treatment for the first wafer W8 continues while coating/developing treatments are being performed on a second wafer W9 and a third wafer W10 and is completed while coating/developing treatments are being performed on a fourth wafer W11.

Since a long standby time is necessary till the test treatment for the first wafer W8 is completed when the second wafer W9 is determined as the substrate to be tested, the control unit 800 does not determine the second wafer W9 as the substrate to be tested.

The control unit 800 determines an estimated test treatment completion times for the third wafer W10 not to be more than the estimated necessary time Td for the entire operation treatments for the wafers W8 to W13 of the second lot 20b and determines the third wafer W10 as the substrate to be tested. A test treatment for the third wafer W10 continues while coating/developing treatments are being performed on a fifth wafer W12 and a sixth wafer W13. Since it is determined to be more than the estimated necessary time for the entire operation treatment when the fifth wafer W12 and the sixth wafer 13 are test-treated, the control unit 800 does not determine the fifth wafer W12 and the sixth wafer W13 as the substrate to be tested.

According to the determination of the control unit 800, in the first lot 20a, the first, third, fifth wafers W1, W3, and W5 are determined as the substrate to be tested and the second, fourth, sixth, and seventh wafers W2, W4, W6, and W7 are not determined as the substrate to be tested. Also, in the second lot 20b, the first and third wafers W8 and W10 are determined as the substrate to be tested and the second, fourth, fifth, and sixth wafers W9, W11, W12, and W13 are not determined as the substrate to be tested. As described above, although the numbers of wafers provided in the lots 20a and 20b and wafer test treatment times for each of the lots 20a and 20b are different from one another, since the control unit 800 flexibly determines the substrate to be tested to allow the test treatment to be completed before the estimated necessary time Td for the entire operation treatments for the wafers is finished, a standby time caused by the test treatment may not occur.

Figure 7:
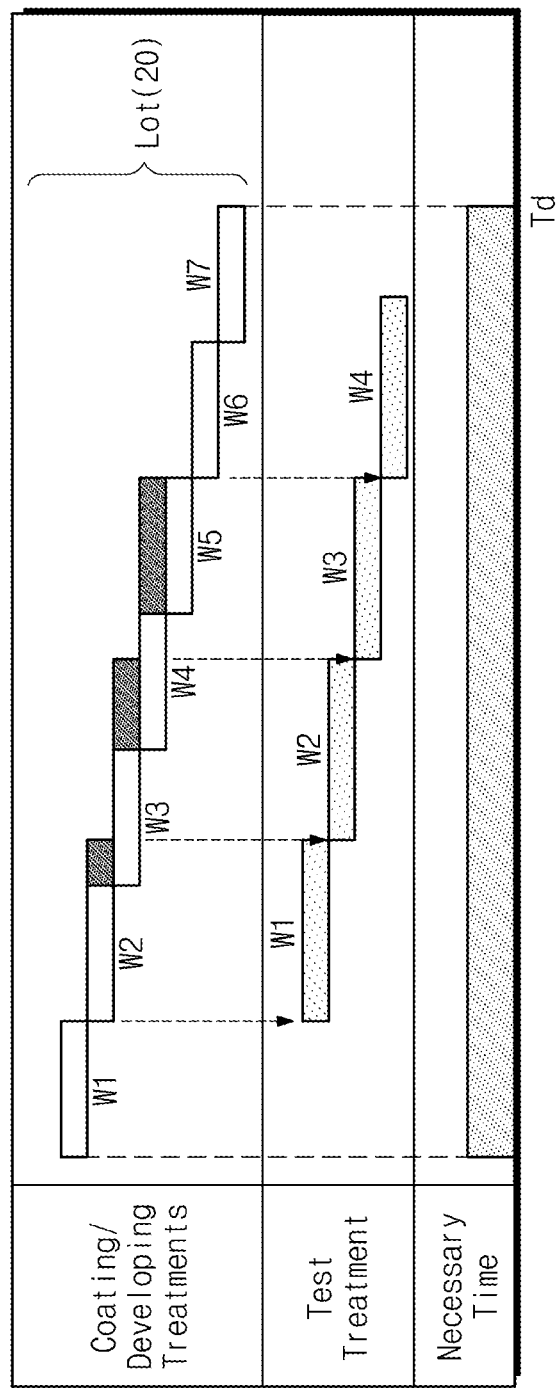
FIG. 7 is a view illustrating an order, in which the control unit determines a substrate to be tested, according to still another embodiment of the present invention.

FIG. 7 is a view illustrating an order, in which the control unit 800 determines a substrate to be tested, according to still another embodiment of the present invention.

Referring to FIG. 7, the control unit 800 performs an automatic quantity serial test. In FIGS. 5 and 6, the substrate to be tested is determined with a certain cycle. In the embodiment, wafers are sequentially determined as the substrate to be tested in an order of completing coating/developing treatments.

As an example, it will be described that seven wafers W1 to W7 are contained in the lot 20. The control unit 800 calculates an estimated necessary time Td for the entire operation treatments performed on the seven wafers W1 to W7. Based on the calculated estimated necessary time, the substrate to be tested is determined. When a first wafer W1 is completed with the coating/developing treatments, the control unit 800 determines an estimated test treatment completion time for the first wafer W1 not to be more than the estimated necessary time Td for the entire operation treatments and determines the first wafer W1 as the substrate to be tested. A test treatment for the first wafer W1 continues while coating/developing treatments are being performed on a second wafer W2. The control unit 800 allows the second wafer W2 completed with the coating/developing treatments to stand by and determines whether the wafer W2 is the substrate to be tested. Based on a point in time of completing the test treatment for the first wafer W1, a test treatment completion time for the second wafer W2 is estimated and is determined not to be more than the estimated necessary time Td for the entire operation treatments, thereby determining the second wafer W2 as the substrate to be tested. Using a method described above, the control unit 800 sequentially determines a third wafer W3 and a fourth wafer W4 as the substrate to be tested. The control unit 800 estimates a test treatment completion time for a fifth wafer W5 based on a point in time when a test treatment for the fourth wafer W4 is completed, determines the test treatment completion time for the fifth wafer W5 to be more than the estimated necessary time Td for the entire operation treatments, and does not determine the fifth wafer W5 as the substrate to be tested. A sixth wafer W6 and a seventh wafer W7 are not determined as the substrate to be tested, based on the same reason of the fifth wafer W5.

According to a determination of the control unit 800, in the lot 20, the first to fourth wafers W1 to W4 are determined as the substrate to be tested and the fifth to seventh wafers W5 to W7 are not determined as the substrate to be tested. As described above, the control unit 800 may continuously determine wafers W in the order of being completed with the coating/developing treatments as the substrate to be tested.

Figure 8:
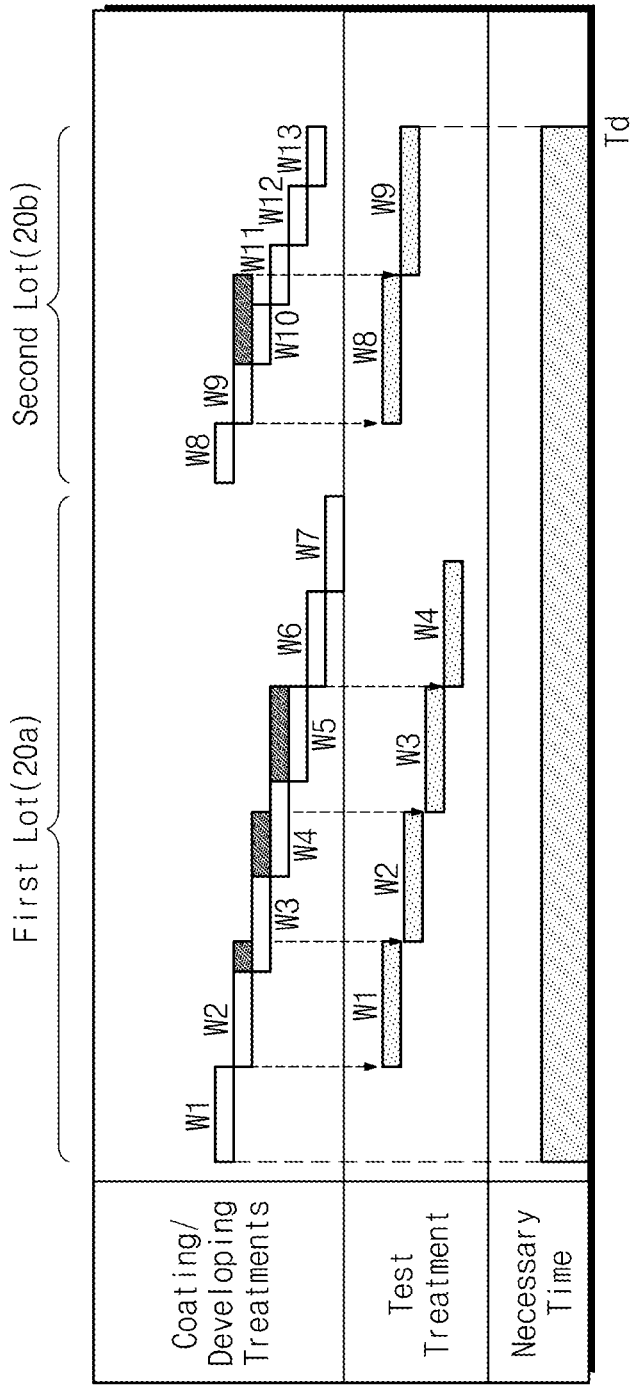
FIG. 8 is a view illustrating an order, in which the control unit determines a substrate to be tested, according to yet another embodiment of the present invention.

FIG. 8 is a view illustrating an order, in which the control unit 800 determines a substrate to be tested, according to yet another embodiment of the present invention.

Referring to FIG. 8, two lots 20a and 20b are provided. In a first lot 20a, seven wafers W1 to W7 may be contained. In a second lot 20b, six wafers W8 to W13 may be contained. Coating/developing and test treatments are performed on the wafers W1 to W7 of the first lot 20a and then coating/developing and test treatments are performed on the wafers W8 to W13 of the second lot 20b. A test treatment time for the wafers W8 to W13 of the second lot 20b may be longer than a test treatment time for the wafers W1 to W7 of the first lot 20a.

Since the coating/developing and test treatments for the wafers W1 to W7 of the first lot 20a is identical to the embodiment of FIG. 7 described above, a detailed description thereof will be omitted.

At a point in time when the coating/developing treatments for a first wafer W8 of the second lot 20b are completed, a test treatment is not performed. The control unit 800 determines an estimated test treatment completion time for the first wafer W8 of the second lot 20b not to be more than an estimated necessary time Td for the entire operation treatments for the wafers W8 to W13 of the second lot 20b and determines the first wafer W8 as a substrate to be tested. A test treatment on the first wafer W8 continues while the coating/developing treatments are being performed on the second to fourth wafers W9 to W11. The control unit 800 determines whether the second wafer W9 completed with the coating/developing treatments is the substrate to be tested or not, based on a point in time when the test treatment for the first wafer W8 is completed. The control unit 800 determines an estimated test treatment completion time for the second wafer W9 not to be more than the estimated necessary time Td for the entire operation treatments and determines the second wafer W9 as the substrate to be tested. The control unit 800 estimates test treatment completion times for third to sixth wafers W10 to W13 completed with coating/developing treatments based on a point in time when a test treatment for the second wafer W9 is completed, determines the test treatment completion times for third to sixth wafers W10 to W13 to be more than the estimated necessary time Td for the entire operation treatments, and does not determine the third to sixth wafers W10 to W13 as the substrate to be tested.

Figure 9:
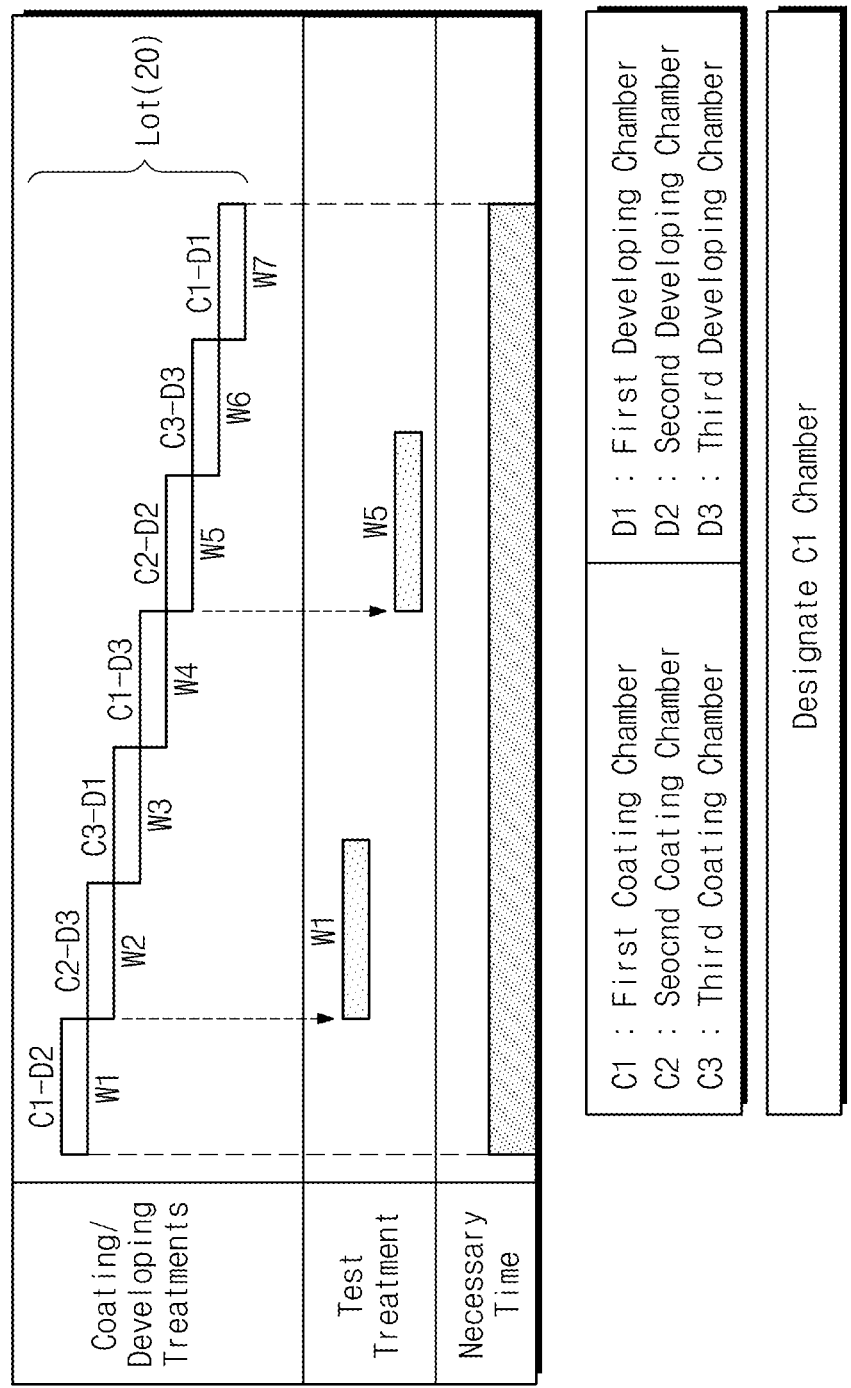
FIG. 9 is a view illustrating an order, in which the control unit determines a substrate to be tested, according to even another embodiment of the present invention.

FIG. 9 is a view illustrating an order, in which the control unit 800 determines a substrate to be tested, according to even another embodiment of the present invention.

Referring to FIG. 9, a plurality of coating chambers C1 to C3 and a plurality of developing chambers D1 to D3 are provided, respectively. According to the embodiment, there are provided three coating chambers C1 to C3 and three developing chambers D1 to D3. In the coating chambers C1 to C3, coating treatments are performed, respectively. In the developing chambers D1 to D3, developing treatments are performed, respectively. In the embodiment, as an example, it will be described that seven wafers W1 to W7 are contained in the lot 20.

The wafers W1 to W7 contained in the lot 20 are sequentially provided to the coating chambers C1 to C3 and the developing chambers D1 to D3, one by one. According to the embodiment, an coating treatment is performed on a first wafer W1 in a first coating chamber C1 and a developing treatment is performed on the first wafer W1 in a second developing chamber D2. An coating treatment is performed on a second wafer W2 in a second coating chamber C2 and a developing treatment is performed on the second wafer W2 in a third developing chamber D3. An coating treatment is performed on a third wafer W3 in a third coating chamber C3 and a developing treatment is performed on the third wafer W3 in a first developing chamber D1. An coating treatment is performed on a fourth wafer W4 in the first coating chamber C1 and a developing treatment is performed on the fourth wafer W4 in the third developing chamber D3. An coating treatment is performed on a fifth wafer W5 in the second coating chamber C2 and a developing treatment is performed on the fifth wafer W5 in the second developing chamber D2. An coating treatment is performed on a sixth wafer W6 in the third coating chamber C3 and a developing treatment is performed on the sixth wafer W6 in the third developing chamber D3. Also, an coating treatment is performed on a seventh wafer W7 in the first coating chamber C1 and a developing treatment is performed on the seventh wafer W7 in the third developing chamber D3. As described above, the coating/developing treatments may be performed on the wafers W1 to W7, respectively, while being provided in the coating chambers C1 to C3 and the developing chambers D1 to D3 different from one another. Orders of the coating chambers C1 to C3 and the developing chambers D1 to D3, to which the wafers W1 to W7 are provided, may be variously changed.

The control unit may determine only wafers completed with operation treatments in certain ones among the coating chambers C1 to C3 and the developing chambers D1 to D3 described above as the substrate to be tested. According to the embodiment, the control unit 800 may determine the wafers W1 and W4 completed with the coating treatment in the first coating chamber C1 as the substrate to be tested. The control unit 800 determines estimated test treatment completion times for the first wafer W1 and the fourth wafer W4 completed with the coating treatment in the first coating chamber C1 not to be more than an estimated necessary time Td for the entire operation treatments and determines the first wafer W1 and the fourth wafer W4 as the substrate to be tested. In the case of the seventh wafer W7, the control unit 800 determines an estimated test treatment completion time to be more than the estimated necessary time Td for the entire operation treatments and does not determine the seventh wafer W7 as the substrate to be tested.

As described above, since the control unit 800 determines only the wafers W1 and W4 completed with the operation treatment in the certain chamber C1 as the substrate to be tested, it is possible to check operation treatment properties of the certain chamber C1 through a wafer test. According to the embodiment, the control unit 800 may determine a wafer completed with an operation treatment in a chamber performed with a maintenance/repair operation as the substrate to be tested. Through this, a maintenance/repair state of the chamber may be checked. Also, the control unit 800 may determine only a wafer completed with an operation treatment in a certain chamber as the substrate to be tested in order to check an operation treatment function of the certain chamber.

Figure 10:
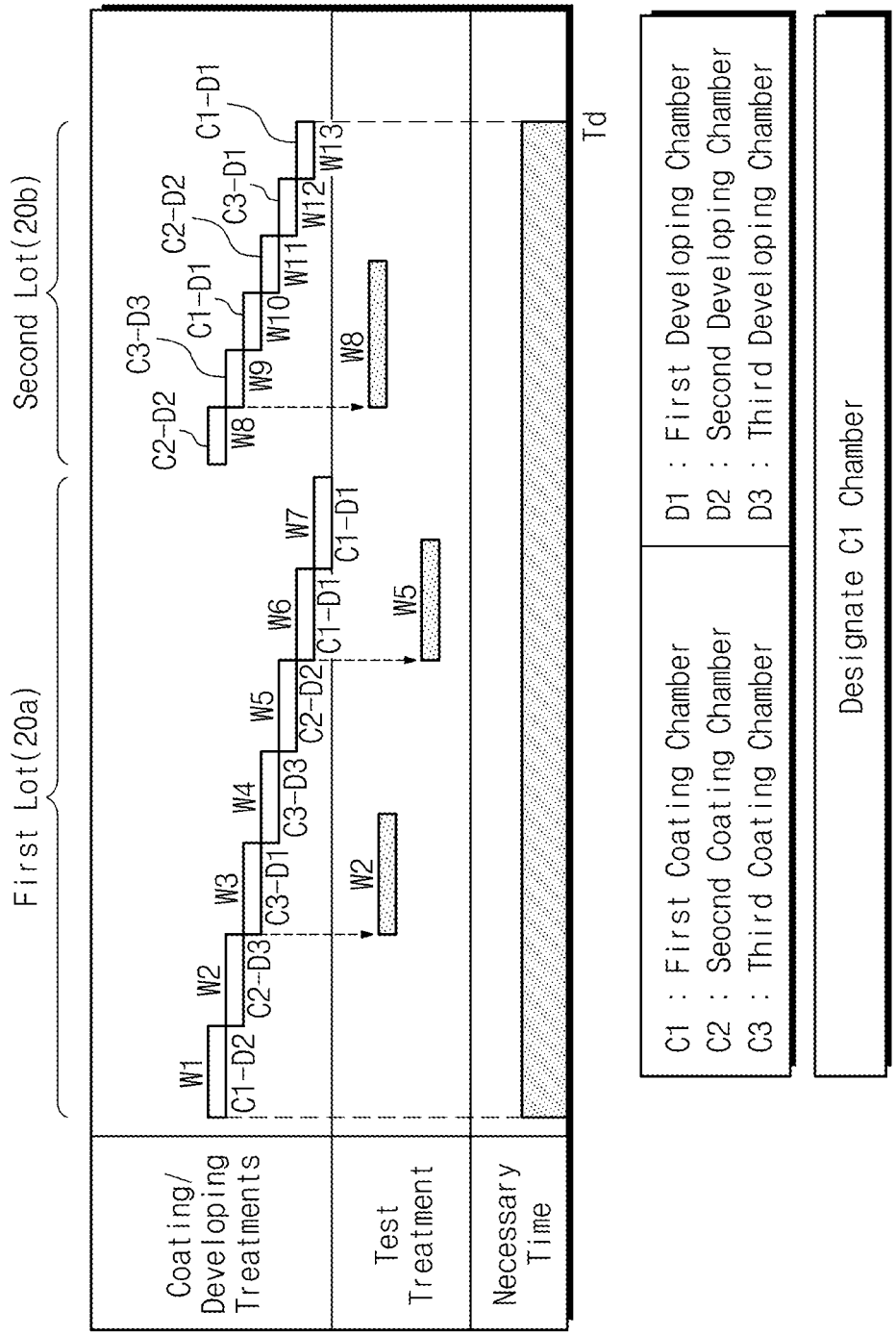
FIG. 10 is a view illustrating an order, in which the control unit determines a substrate to be tested, according to a further embodiment of the present invention.

FIG. 10 is a view illustrating an order, in which the control unit 800 determines a substrate to be tested, according to a further embodiment of the present invention.

Referring to FIG. 10, two lots 20a and 20b are provided. In a first lot 20a, seven wafers W1 to W7 may be contained. In a second lot 20b, six wafers W8 to W13 may be contained.

The control unit 800 determines a second wafer W2 and a fifth wafer W5 of the first lot 20a, completed with operation treatments in a second coating chamber C2 and a first wafer W8 and a fourth wafer W11 of the second lot 20b as the substrate to be tested. Through test treatments for the second wafer W2 and the fifth wafer W5 of the first lot 20a and the first wafer W8 and the fourth wafer W11 of the second lot 20b, a test treatment function of the second coating chamber C2 may be checked.

Figure 11:
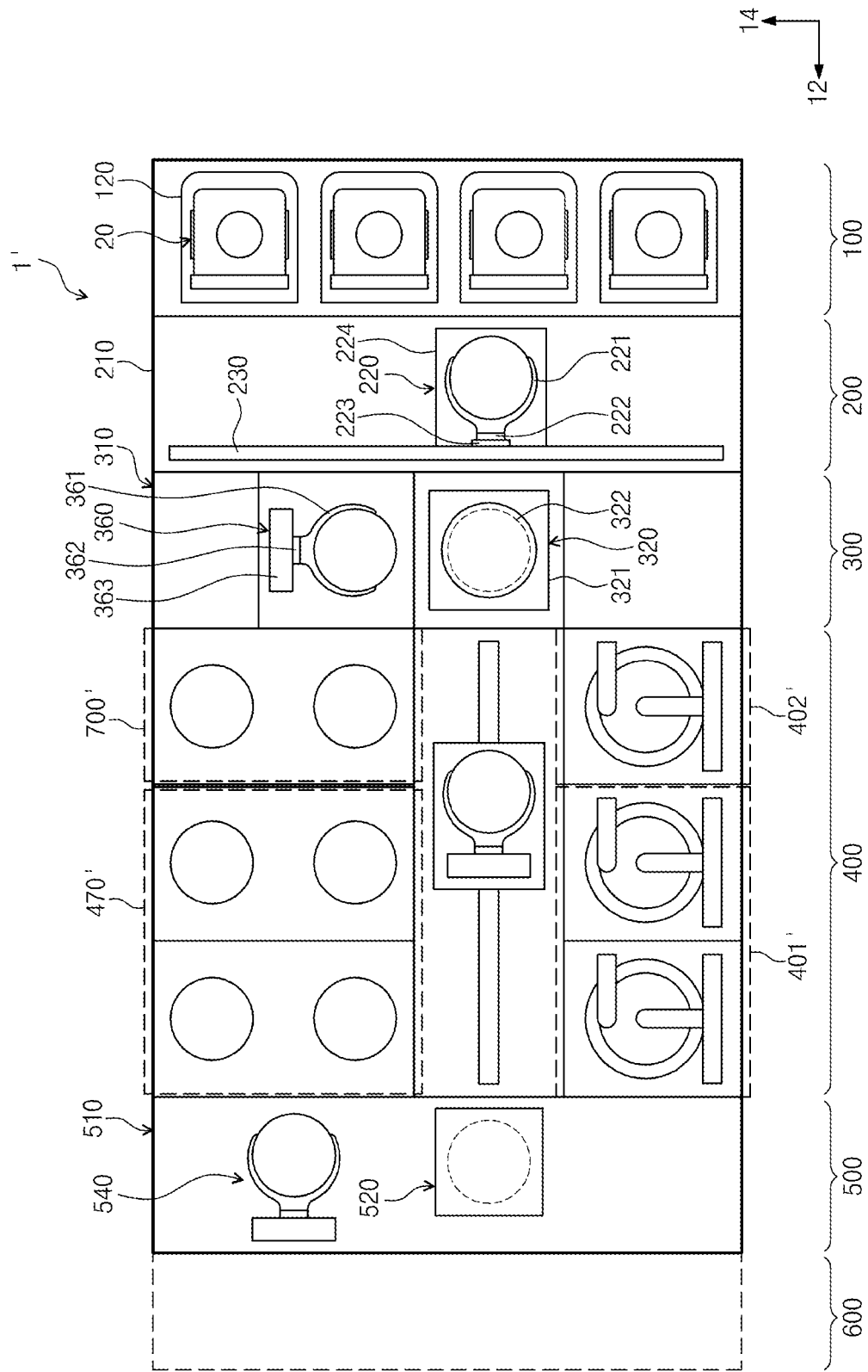
FIG. 11 is a view illustrating a substrate treatment facility according to another embodiment of the present invention.

FIG. 11 is a view illustrating a substrate treatment facility 1' according to another embodiment of the present invention. Referring to FIG. 11, the facility 1' may be provided as a single layer. An coating module 401' and a developing module 402' may be disposed on the same layer. The coating module 401' and the developing module 402' may be arranged in a row in the first direction 12. On the opposite side, a test module 700' and a baking chamber 470' may be arranged in a row. The test module 700' may be disposed between a buffer module 300 and the baking chamber 470.

According to one or more embodiments of the present invention, since a test process is completed within a treatment process time of substrates, a standby time occurring due to a substrate test is prevented.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of treating a substrate, the method comprising:
   treating substrates contained in a lot by performing an operation treatment thereon;
   determining which ones of the substrates are testable substrates subjected to a test treatment based on whether the test treatment for a respective one of the substrates will complete prior to a completion time of the operation treatment for the substrates in the lot; and performing the test treatment on the testable substrates after performing the operation treatment thereon.

2. The method of claim 1, wherein the performing of the test treatment includes estimating the completion time.

3. The method of claim 2, wherein the determining includes determining which ones of the substrate are untestable substrates that are not subjected to the test treatment based on whether the test treatment for a respective one of the substrates will complete later than the completion time of the operation treatment for the substrates in the lot.

4. The method of claim 3, wherein the determining includes sampling some of the substrates after performing the operation treatment.

5. The method of claim 4, wherein the determining includes sequentially determining a substrate as a testable substrate in a same order as the operation treatment is performed.

6. The method of claim 1, wherein the performing the operation treatment includes,
 coating a substrate with photoresist, and
 performing a developing treatment on the substrate coated with the photoresist, and
the determining includes determining the substrate as one of the testable substrates after performing the developing treatment.

7. The method of claim 6, wherein the performing the developing treatment comprises:

performing a developing operation on the substrate coated with the photoresist; and performing a heat treatment on the substrate after performing the developing operation.

8. The method of claim 1, wherein the operation treatment is performed in a treating device having a plurality of chambers, and in the determining includes determining only the substrates completed with the operation treatment in a certain one among the chambers as the testable substrates.

9. The method of claim 1, wherein the operation treatment is performed in a treating device having a plurality of chambers, and the determining determines the testable substrates such that at least one of the testable substrates is associated with each of the chambers.

10. The method of claim 1, wherein the lot comprises:

a first lot containing n number of substrates and a second lot containing m number of substrates, wherein after performing the operation treatment and the test treatment on the substrates of the first lot, the operation treatment and the test treatment are performed on the substrates of the second lot, the determining includes determining which ones of the substrates of the first lot are testable substrates among the substrates of the first lot to allow the test treatment for the substrates of the first lot to be completed within the completion time of the operation treatment for the substrates of the first lot, and the determining includes determining which ones of the substrates of the second lot are testable substrates among the substrates of the second lot to allow the test treatment for the substrates of the second lot to be completed within the completion time of the operation treatment for the substrates of the second lot.

11. The method of claim 10, wherein an order of determining the testable substrate among the substrates of the first lot differs from an order of determining the testable substrates among the substrates of the second lot.

12. The method of claim 10, wherein n is a natural number greater than m, and a number of the testable substrates determined among the substrates of the first lot, is greater than a number of the testable substrates, determined among the substrates of the second lot.

13. A substrate treatment facility comprising:

a load port having a lot containing a plurality of substrates;

a treating device configured to perform an operation treatment on the substrate;

a transferring apparatus between the load port and the treating device, the transferring apparatus including an index robot configured to transfer the substrate;

a controller configured to determine which ones of the substrates are testable substrates subjected to a test treatment based on whether the test treatment for a respective one of the substrates will complete prior to a completion time of the operation treatment for the plurality of substrates in the lot; and a testing device configured to perform the test treatment on a the testable substrates after the operation treatment is performed in the treating device.

14. The facility of claim 13, wherein the treating device is configured to,
 coat the substrates with photoresist, and
 perform a developing treatment on the substrates coated with the photoresist, and the controller is configured to determine the substrates as the testable substrates after the developing treatment is performed.

15. The facility of claim 14, wherein the treating device has a multi-layer structure including,
 a plurality of developing chambers configured to perform a developing operation, the plurality of developing chambers being arranged in a row, and
 a plurality of baking chambers configured to perform a heat treatment on a substrate performed with the developing operation, the baking chambers being arranged in parallel with the developing chambers, and the testing device includes test chambers located between the transferring apparatus and the baking chambers, the test chambers configured to test the substrate completed with the heat treatment.

16. The facility of claim 14, wherein the treating device has a single layer structure including,
 a plurality of developing chambers configured to perform a developing operation,
 a plurality of baking chambers configured to perform a heat treatment on a substrate performed with the developing operation, and
 a plurality of coating chambers configured to perform the coating treatment, the developing chambers and the coating chambers are arranged in a row in one direction, the baking chambers are arranged in a row in parallel with the developing chambers and the coating chambers, and the testing device includes a test chamber located between the transferring apparatus and the baking chambers, the test chamber configured to test the substrate completed with the heat treatment.

17. The facility of claim 13, wherein
the treating device includes a plurality of chambers configured to perform the same treatment on the substrate, and
the controller is configured to determine only a substrate completed with the operation treatment in a certain one of the chambers as one of the testable substrates.

18. The facility of claim 13, wherein
the treating device includes a plurality of chambers performing the same treatment on the substrate, and
the controller is configured to determine at least one substrate completed with the operation treatment for each of the chambers as one of the testable substrates.

19. The facility of claim 13, wherein
the lot includes a first lot containing n number of substrates and a second lot containing m number of substrates, and
the controller is configured to,
control treatments to be sequentially performed on the m number of substrates of the second lot after completing the treatments on the n number of substrates of the first lot,
determine the testable substrates among the substrates of the first lot to allow the test treatment for the substrates of the first lot to be completed within the completion time of an operation treatment for the n number of substrates of the first lot, and
determine the testable substrates among the substrates of the second lot to allow the test treatment for the substrates of the second lot to be completed within the completion time of an operation treatment for the m number of substrates of the second lot.

20. The facility of claim 19, wherein the controller is configured to control an order of determining the testable substrates among the substrates of the first lot to differ from an order of determining the testable substrates among the second substrates of the second lot.

\* \* \* \* \*